US012712164B2

(12) United States Patent
Kim et al.

(10) Patent No.: US 12,712,164 B2
(45) Date of Patent: Aug. 18, 2026

(54) COVER WAFER AND METHOD OF CLEANING SUBSTRATE PROCESSING APPARATUS INCLUDING THE SAME

(71) Applicant: SAMSUNG ELECTRONICS CO., LTD., Suwon-si (KR)

(72) Inventors: Doyoung Kim, Suwon-si (KR); Seungkyu Lim, Suwon-si (KR); Nohsung Kwak, Suwon-si (KR); Minkyu Park, Suwon-si (KR); Daegyu Lim, Suwon-si (KR); Eunkyeom Kim, Suwon-si (KR); Hyeonggyu Kim, Suwon-si (KR); Taemin Park, Suwon-si (KR); Wonbo Shim, Suwon-si (KR); Sungjun Ann, Suwon-si (KR); Jinwoo Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 351 days.

(21) Appl. No.: 18/515,977

(22) Filed: Nov. 21, 2023

(65) Prior Publication Data

US 2024/0203710 A1 Jun. 20, 2024

(30) Foreign Application Priority Data

Dec. 16, 2022 (KR) ........................ 10-2022-0177392

(51) Int. Cl.
*H01J 37/32* (2006.01)
*C23C 16/44* (2006.01)

(52) U.S. Cl.
CPC .... *H01J 37/32862* (2013.01); *C23C 16/4405* (2013.01)

(58) Field of Classification Search
CPC ...................... H01J 37/32862; H01J 37/32477
See application file for complete search history.

(56) References Cited

U.S. PATENT DOCUMENTS 6,769,439 B2 8/2004 Tamura
7,816,272 B2 10/2010 Tsutae
(Continued)

FOREIGN PATENT DOCUMENTS

JP 4558431 B2 10/2010
KR 10-2012-0045029 A 5/2012

OTHER PUBLICATIONS

Office Action in Korean Appln. No. 10-2022-0177392, mailed on Apr. 20, 2026, 20 pages (with English translation).

*Primary Examiner* — Thao P Le
(74) *Attorney, Agent, or Firm* — Fish & Richardson P.C.

(57) ABSTRACT

A method of cleaning a substrate processing apparatus that provides a processing space for accommodating a process wafer and includes a substrate support including an internal electrode, the method includes disposing a cover wafer on an upper surface of the substrate support; fixing the cover wafer to the substrate support using the internal electrode of the substrate support; plasma cleaning the processing space; and removing a current of the internal electrode and removing the cover wafer, wherein the cover wafer includes silicon carbide (SiC), a lower surface of the cover wafer is in contact with the substrate support, and an average roughness of an upper surface of the cover wafer is less than an average roughness of an upper surface of the process wafer.

20 Claims, 11 Drawing Sheets

(56) References Cited

U.S. PATENT DOCUMENTS

| | | | | |
|---|---|---|---|---|
| 7,824,498 | B2 | 11/2010 | Parkhe et al. | |
| 10,541,171 | B2 | 1/2020 | Parkhe | |
| 2014/0263169 | A1* | 9/2014 | Lee | C23C 14/34 216/37 |
| 2014/0318575 | A1 | 10/2014 | Parkhe | |
| 2018/0269039 | A1 | 9/2018 | Sun et al. | |
| 2020/0027724 | A1* | 1/2020 | Jung | H10P 70/80 |
| 2022/0013393 | A1* | 1/2022 | Jung | H10P 72/0414 |
| 2022/0020609 | A1* | 1/2022 | Park | H10P 70/80 |
| 2022/0115218 | A1 | 4/2022 | Nagayama et al. | |
| 2022/0122822 | A1 | 4/2022 | Parimi et al. | |
| 2022/0130706 | A1 | 4/2022 | Lin et al. | |
| 2022/0344135 | A1* | 10/2022 | Sheng | B08B 7/0035 |
| 2023/0187189 | A1* | 6/2023 | Jung | C23C 16/509 219/121.59 |
| 2023/0245858 | A1* | 8/2023 | Kato | C23C 16/45548 118/728 |

* cited by examiner

FIG. 3

| | | | | | | | |
|---|---|---|---|---|---|---|---|
| ALN CW CLN | WF | 1 | 2 | 3 | 4 | 5 | 6 |
| | NUMBER OF P/C (ea) | 159 | 87 | 52 | 43 | 70 | 77 |
| ALN CW CLN | WF | 7 | 8 | 9 | 10 | 11 | 12 |
| | NUMBER OF P/C (ea) | 84 | 77 | 29 | 55 | 56 | 79 |
| SIC CW CLN (Ra 0.4μm) | WF | 1 | 2 | 3 | 4 | 5 | 6 |
| | NUMBER OF P/C (ea) | 2284 | 419 | 379 | 439 | 286 | 370 |
| SIC CW CLN (Ra 0.4μm) | WF | 7 | 8 | 9 | 10 | 11 | 12 |
| | NUMBER OF P/C (ea) | 2288 | 870 | 748 | 528 | 413 | 4094 |
| SIC CW CLN (Ra ≤0.2μm) | WF | 1 | 2 | 3 | 4 | 5 | 6 |
| | NUMBER OF P/C (ea) | 22 | 10 | 6 | 12 | 9 | 16 |
| SIC CW CLN (Ra ≤0.2μm) | WF | 7 | 8 | 9 | 10 | 11 | 12 |
| | NUMBER OF P/C (ea) | 10 | 11 | 12 | 9 | 8 | 6 |

COVER WAFER AND METHOD OF CLEANING SUBSTRATE PROCESSING APPARATUS INCLUDING THE SAME

CROSS-REFERENCE TO RELATED APPLICATION

This application is based on and claims priority under 35 U.S.C. § 119 to Korean Patent Application No. 10-2022-0177392, filed on Dec. 16, 2022, in the Korean Intellectual Property Office, the disclosure of which is incorporated by reference herein in its entirety.

BACKGROUND

1. Field

Embodiments relate to a cover wafer and a method of cleaning a substrate processing apparatus including the cover wafer.

2. Description of the Related Art

Semiconductors may be manufactured by various processes, such as chemical vapor deposition, physical vapor deposition, or ion injection. These processes may generally be performed in a process chamber using plasma.

SUMMARY

The embodiments may be realized by providing a method of cleaning a substrate processing apparatus that provides a processing space for accommodating a process wafer and includes a substrate support including an internal electrode, the method including disposing a cover wafer on an upper surface of the substrate support; fixing the cover wafer to the substrate support using the internal electrode of the substrate support; plasma cleaning the processing space; and removing a current of the internal electrode and removing the cover wafer, wherein the cover wafer includes silicon carbide (SiC), a lower surface of the cover wafer is in contact with the substrate support, and an average roughness of an upper surface of the cover wafer is less than an average roughness of an upper surface of the process wafer.

The embodiments may be realized by providing a cover wafer for plasma cleaning of a chamber that provides a processing space for accommodating a process wafer and includes a substrate support that includes a dielectric plate, the cover wafer including a lower surface in contact with the substrate support; and an upper surface that is opposite to the lower surface, the upper surface having an average roughness that is less than an average roughness of the process wafer, wherein the cover wafer is on the substrate support and includes silicon carbide (SiC), and a width of the upper surface of the cover wafer is greater than a width of an upper surface of the dielectric plate and less than a width of the substrate support.

The embodiments may be realized by providing a substrate processing apparatus including a chamber providing a plasma processing space for accommodating a process wafer; a substrate support in the chamber and including a dielectric plate; a cover wafer on the substrate support; and a plasma source configured to form plasma in the plasma processing space, wherein the cover wafer includes silicon carbide (SiC) and includes a lower surface in contact with the substrate support; and an upper surface that is opposite to the lower surface, the upper surface having an average roughness that is less than an average roughness of the process wafer.

BRIEF DESCRIPTION OF THE DRAWINGS

Features will be apparent to those of skill in the art by describing in detail exemplary embodiments with reference to the attached drawings in which:

FIG. 3 is a table illustrating the number of particles generated by a method of cleaning a substrate processing apparatus, according to an embodiment;

DETAILED DESCRIPTION

Figure 1:
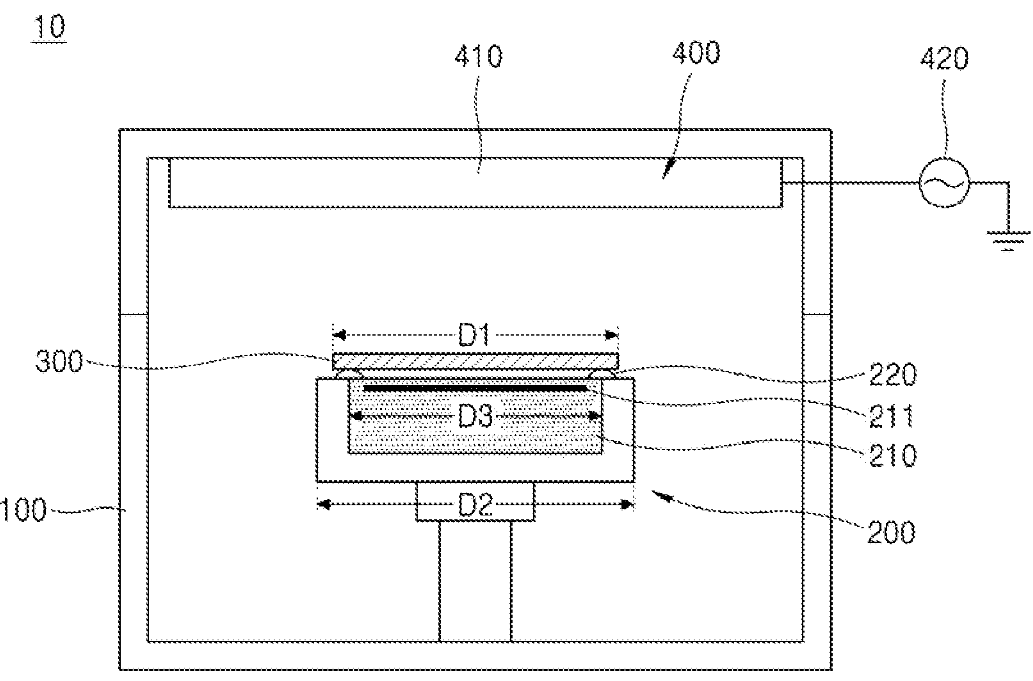
FIG. 1 is a block diagram schematically illustrating a chamber according to an embodiment.
Figure 2:
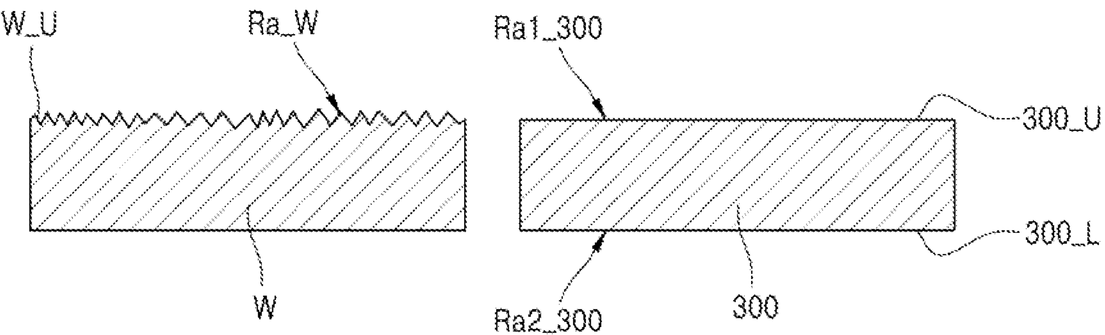
FIG. 2 is a cross-sectional view schematically illustrating a cover wafer according to an embodiment.

FIG. 1 is a block diagram schematically illustrating a chamber 100 according to an embodiment. FIG. 2 is a cross-sectional view schematically illustrating a cover wafer 300 according to an embodiment.

Referring to FIGS. 1 and 2, a substrate processing apparatus 10 may include the chamber 100, a substrate support 200, the cover wafer 300, and a plasma source 400.

The chamber 100 of the substrate processing apparatus 10 may provide a processing space therein, in which a process wafer W may be processed. In an implementation, the chamber 100 may have a cylindrical shape. The processing space may be sealed from the outside of the chamber 100 by an upper wall and a side wall of the chamber 100.

In an implementation, the chamber 100 may include an exhaust hole in a lower portion thereof. The exhaust hole may be connected to an exhaust line having a pump mounted thereon. The exhaust hole may discharge reaction byproducts generated during a photolithography process and gases remaining inside the chamber 100 to the outside of the chamber 100 through the exhaust line. In this case, an internal space of the chamber 100 may be decompressed to certain pressure.

The process wafer W may include silicon (Si). In an implementation, the process wafer W may include a semiconductor element, e.g., germanium (Ge), or a compound semiconductor, such as silicon carbide (SiC), gallium arsenide (GaAs), indium arsenide (InAs), or indium phosphide (InP). In an implementation, the process wafer W may have a silicon on insulator (SOI) structure. As used herein, the term "or" is not an exclusive term, e.g., "A or B" would include A, B, or A and B.

The process wafer W may undergo an etching process, a chemical vapor deposition (CVD) process, or a physical vapor deposition (PVD) process by plasma. Through these processes, the process wafer W may include an active surface and an inactive surface that is opposite to the active surface.

The substrate support 200 of the substrate processing apparatus 10 may have the process wafer W or the cover wafer 300 thereon. The substrate support 200 may include a dielectric plate 210. The dielectric plate 210 may include a dielectric material. The dielectric plate 210 may have a disc shape. The dielectric plate 210 may have a radius that is smaller than that of the process wafer W and that of the cover wafer 300.

The dielectric plate 210 may include an internal electrode 211. A power source may be connected to the internal electrode 211, and the internal electrode 211 may receive power from the power source. The dielectric plate 210 may generate an electrostatic force by using the internal electrode 211 to fix the process wafer W or the cover wafer 300 to the substrate support 200. In an implementation, the substrate support 200 may include an electrostatic chuck (ESC).

In an implementation, the dielectric plate 210 may include a plurality of support portions 220 on an upper surface thereof. The support portion 220 may be in direct contact with the process wafer W or the cover wafer 300. The process wafer W or the cover wafer 300 may be spaced apart from the upper surface of the dielectric plate 210. In an implementation, the process wafer W or the cover wafer 300 may be spaced apart from the upper surface of the dielectric plate 210 with the plurality of support portions 220 therebetween.

The plurality of support portions 220 may be arranged in an embossing form. In an implementation, a lower surface of the process wafer W or a lower surface of the cover wafer 300 may be in contact (e.g., direct contact) with the plurality of support portions 220 at a plurality of points. The process wafer W or the cover wafer 300 may be loaded on the substrate support 200 without being inclined to one side because of the plurality of support portions 220.

In an implementation, as illustrated in FIG. 1, two support portions 220 may be on an upper surface of the substrate support 200, or three or more support portions 220 may be on the upper surface of the substrate support 200.

The plasma source 400 of the substrate processing apparatus 10 may excite cleaning gas in the chamber 100 to a plasma state. As the plasma source 400, an inductively coupled plasma (ICP) source or a capacitively coupled plasma (CCP) source may be used. In an implementation, the cleaning gas may include oxygen ($O_2$) or nitrogen trifluoride ($NF_3$).

In an implementation, when the plasma source 400 is an ICP source, the plasma source 400 may include an antenna and an external power source 420. The antenna may be on an outer upper portion of the chamber 100. The antenna may have a spiral shape wound multiple times and connected to the external power source 420. The antenna may receive power from the external power source 420. The antenna to which power is applied may form a discharge space in the processing space of the chamber 100. The cleaning gas staying in the discharge space may be excited to the plasma state.

In an implementation, when the plasma source 400 is a CCP source, the plasma source 400 may include an upper electrode 410 and the external power source 420. The upper electrode 410 may be at an inner upper portion of the chamber 100. The upper electrode 410 may be connected to the external power source 420. The upper electrode 410 may receive power from the external power source 420. The upper electrode 410 to which power is applied may form a discharge space in the processing space of the chamber 100. The cleaning gas staying in the discharge space may be excited to the plasma state.

When the plasma source 400 is a CCP source, a lower electrode corresponding to the upper electrode 410 may be the internal electrode 211 of the substrate support 200. In an implementation, the plasma source 400 may form the discharge space in the processing space by using the upper electrode 410 and the internal electrode 211. In an implementation, during a plasma process, an object to be deposited may gather above the internal electrode 211, and during plasma cleaning, residue may gather above the internal electrode 211.

During plasma cleaning of the substrate processing apparatus 10, the substrate processing apparatus 10 may include the cover wafer 300. In an implementation, during plasma cleaning of the processing space inside the chamber 100, the cover wafer 300 may be used.

The cover wafer 300 may be on the substrate support 200. The cover wafer 300 may cover (e.g., protect) the dielectric plate 210 of the substrate support 200 during plasma cleaning of the inside of the chamber 100. In an implementation, the cover wafer 300 may not expose the dielectric plate 210 (e.g., to the outside) during plasma cleaning.

In an implementation, the cover wafer 300 may be spaced apart from an upper surface of the dielectric plate 210 by the plurality of support portions 220. In an implementation, a separation distance between the cover wafer 300 and the dielectric plate 210 may be short, and the dielectric plate 210 may not be substantially exposed (e.g., to the outside).

The cover wafer 300 may be attached to the substrate support 200. In an implementation, the cover wafer 300 may be fixed to the dielectric plate 210 by an electrostatic force.

The cover wafer 300 may have an upper surface 300_U and a lower surface 300_L that is opposite to the upper surface 300_U. The lower surface 300_L of the cover wafer 300 may be in contact (e.g., direct contact) with the substrate support 200. The upper surface 300_U of the cover wafer 300 may face the upper electrode 410.

Average roughness indicates sizes (e.g., heights or depths) of minute concaves (e.g., valleys) and convexes (e.g., peaks) on the surface of an object. In a process of shaping and cutting an object, a plurality of minute and irregular concaves and convexes may be generated on the surface of the object. A value obtained by calculating sizes of these concaves and convexes may be expressed as average roughness.

In an implementation, central line average roughness indicates a central line of the surface in a cross-section of an object. Thereafter, an area of concaves and convexes of the object deviated from the central line may be calculated based on the central line of the surface to obtain an average per length of the central line, thereby indicating an average line. The central line average roughness is defined by a difference between these indicated central line and average line.

In an implementation, the central line average roughness may be indicated by a value obtained by dividing, by a certain measurement length, a line (i.e., an average line) made even by cutting threads existing within the measurement length and filling valleys. In this case, a central line is a reference for distinguishing the threads from the valleys.

Average roughness may include ten-point average roughness besides the central line average roughness. A unit of average roughness is micrometer. Hereinafter, average roughness may indicate central line average roughness.

FIG. 2 shows magnified cross-sectional views of the cover wafer 300 and the process wafer W. With reference to FIG. 2, an average roughness Ra1_300 of the upper surface 300_U of the cover wafer 300, an average roughness Ra2_300 of the lower surface 300_L of the cover wafer 300, and an average roughness Ra_W of an upper surface W_U of the process wafer W are compared to one another. To help understanding, concaves and convexes of the surfaces of the cover wafer 300 and the process wafer W are exaggerated in FIG. 2. Furthermore, to help understanding, a lower surface of the process wafer W is omitted in FIG. 2.

The average roughness Ra1_300 of the upper surface 300_U of the cover wafer 300 may be less than the average roughness Ra_W of the upper surface W_U of the process wafer W. In an implementation, the upper surface W_U of the process wafer W may be rougher than the upper surface 300_U of the cover wafer 300. In an implementation, the upper surface W_U of the process wafer W may have more minute and irregular concaves and convexes than the upper surface 300_U of the cover wafer 300.

In an implementation, the average roughness Ra2_300 of the lower surface 300_L of the cover wafer 300 may be less than the average roughness Ra_W of the upper surface W_U of the process wafer W. In an implementation, the upper surface W_U of the process wafer W may be rougher than the lower surface 300_L of the cover wafer 300. In an implementation, the upper surface W_U of the process wafer W may have more minute and irregular concaves and convexes than the lower surface 300_L of the cover wafer 300.

In an implementation, the average roughness Ra1_300 of the upper surface 300_U of the cover wafer 300 may be about 0.05 μm to about 0.15 μm. In an implementation, the average roughness Ra2_300 of the lower surface 300_L of the cover wafer 300 may be about 0.05 μm to about 0.15 μm.

A constituent material of the cover wafer 300 may include SiC. The constituent material of the cover wafer 300 may not react with cleaning gas used for plasma cleaning. In an implementation, the constituent material of the cover wafer 300 may not react with $O_2$ gas or $NF_3$ gas.

In an implementation, the constituent material of the cover wafer 300 may include CVD-SiC (e.g., SiC formed by CVD). In an implementation, the cover wafer 300 may include high-purity SiC.

In an implementation, a Vickers hardness of the cover wafer 300 may be about 11 gigapascals (GPa) to about 50 GPa. In an implementation, a Young's modulus of the cover wafer 300 may be about 350 GPa to about 600 GPa. In an implementation, a specific resistance of the cover wafer 300 may be about 0.01 ohm·cm to about 10,000 ohm·cm.

A width of the upper surface 300_U of the cover wafer 300 may be greater than a width of the upper surface of the dielectric plate 210 (e.g., as measured in a same direction). The width of the upper surface 300_U of the cover wafer 300 may be less than a width of the substrate support 200. In an implementation, the width of the upper surface 300_U of the cover wafer 300 may be between the width of the upper surface of the dielectric plate 210 and the width of the substrate support 200.

In an implementation, when the substrate support 200, the dielectric plate 210, and the cover wafer 300 each have a cylindrical shape, a diameter of the cover wafer 300 may be a first diameter D1, a diameter of the substrate support 200 may be a second diameter D2, and a diameter of the upper surface of the dielectric plate 210 may be a third diameter D3. The first diameter D1 may be greater than the third diameter D3 and less than the second diameter D2.

In an implementation, when a diameter of the process wafer W is 300 mm, the first diameter D1 of the cover wafer 300 may be less than 300 mm. In an implementation, a width of the cover wafer 300 may be less than a width of the process wafer W, and a portion at which an end portion of the process wafer W is in contact with an end portion of the substrate support 200 during a plasma process may be exposed (e.g., to the outside) during plasma cleaning.

During a plasma process, residue may be generated in a processing space while performing a deposition process or an etching process on the process wafer W. The residue could be a cause of contamination of the process wafer W in a later plasma process. Therefore, residue remaining in the processing space may be removed through plasma cleaning.

The cover wafer 300 according to an embodiment and the substrate processing apparatus 10 including the same may cover the dielectric plate 210 to help suppress a phenomenon that the dielectric plate 210 of the substrate support 200 is damaged in a process of removing residue generated during a plasma process.

The cover wafer 300 according to an embodiment and the substrate processing apparatus 10 including the same may include SiC, which may not to react with a cleaning gas for forming plasma, thereby suppressing formation of particles due to a chemical reaction.

The cover wafer 300 according to an embodiment and the substrate processing apparatus 10 including the same may have the average roughness Ra1_300 of the upper surface 300_U of the cover wafer 300 of about 0.05 μm to about 0.15 μm to help suppress a phenomenon that particles are generated due to physical impacts during plasma cleaning.

The cover wafer 300 according to an embodiment and the substrate processing apparatus 10 including the same may have the average roughness Ra2_300 of the lower surface 300_L of the cover wafer 300 of about 0.05 μm to about 0.15 μm to help increase a contact area between the cover wafer 300 and the substrate support 200, thereby increasing a fixing force of the substrate support 200.

FIG. 3 is a table illustrating a number of particles generated by a method of cleaning a substrate processing apparatus, according to an embodiment.

With reference to FIG. 3, the number of particles generated during plasma cleaning according to the average roughness of an upper surface of a cover wafer and a constituent material of the cover wafer is described.

An experiment was performed by performing a plasma process six times, then performing plasma cleaning, and then measuring the number of particles attached to a process wafer in a plasma process. The table of FIG. 3 shows the number of particles attached to a process wafer after plasma cleaning for each wafer.

The table of FIG. 3 shows experiment values of a first cover wafer including aluminum nitride (AlN), a second cover wafer including SiC and having an upper surface of which the average roughness was about 0.4 μm, and a third cover wafer including SiC and having an upper surface of which the average roughness was about 0.2 μm, according to a constituent material of the cover wafer.

When result values of the use of the first cover wafer are compared to result values of the use of the third cover wafer, particles corresponding to about 10% of the result values of the use of the first cover wafer were attached in the result values of the use of the third cover wafer.

The first cover wafer including AlN may chemically react with cleaning gas during plasma cleaning, thereby generating particles. The third cover wafer including SiC may not chemically react with cleaning gas during plasma cleaning, thereby suppressing the generation of particles.

When result values of the use of the second cover wafer are compared to the result values of the use of the third cover wafer, particles corresponding to about 1% of the result values of the use of the second cover wafer were attached in the result values of the use of the third cover wafer.

The second cover wafer having an upper surface of which the average roughness was about 0.4 μm may receive physical impacts onto concaves and convexes of the upper surface due to plasma during plasma cleaning, thereby generating particles. The third cover wafer having an upper surface of which the average roughness is about 0.2 μm may have less concaves and convexes of the upper surface, thereby suppressing the generation of particles during plasma cleaning.

A cover wafer including SiC and having an upper surface of which the average roughness is about 0.05 μm to about 0.15 μm, according to an embodiment, may not chemically react with plasma and may have little damage during plasma cleaning, thereby suppressing the generation of particles.

Figure 4:
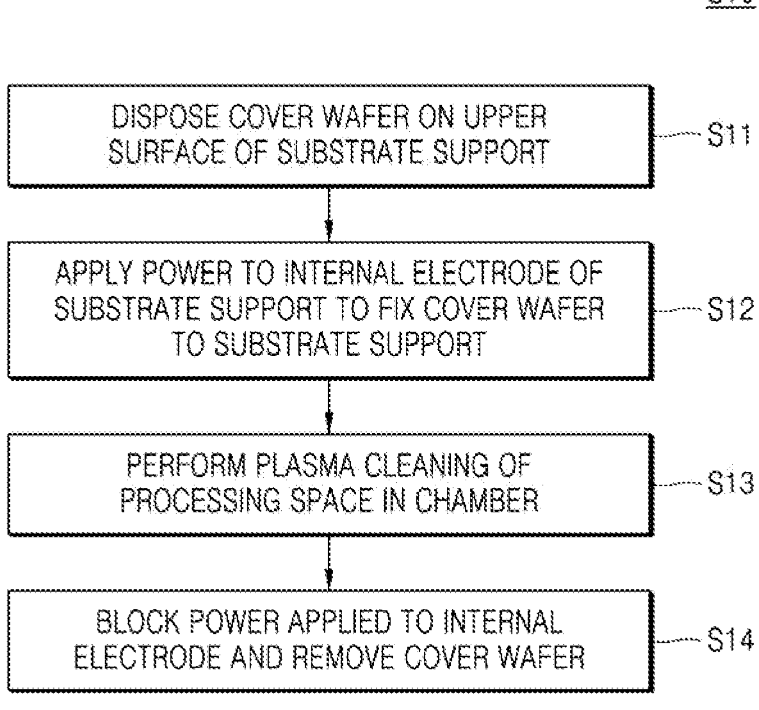
FIG. 4 is a flowchart illustrating a method of cleaning a substrate processing apparatus, according to an embodiment.

FIG. 4 is a flowchart illustrating a method S10 of cleaning a substrate processing apparatus, according to an embodiment.

Referring to FIG. 4, the method S10 may include operation S11 of disposing a cover wafer on a substrate support. After disposing the cover wafer, operation S12 of applying power to an internal electrode of the substrate support to fix the cover wafer to the substrate support may be performed. After fixing the cover wafer, operation S13 of performing plasma cleaning of a processing space in a chamber may be performed. After performing the plasma cleaning, operation S14 of blocking or cutting off the power to the internal electrode and removing the cover wafer may be performed.

FIGS. 5 to 8 are cross-sectional views of stages in a method of cleaning the substrate processing apparatus 10, according to an embodiment.

During a plasma process, residue 101 may be attached in a processing space in the chamber 100. The residue 101 could detach from the chamber 100, and could then be attached to a process wafer in a later plasma process, thereby causing contamination of the process wafer. Therefore, the residue 101 in the processing space may be removed through plasma cleaning. FIGS. 5 to 8 illustrate plasma cleaning for removing the residue 101.

A method of cleaning the substrate processing apparatus 10 is particularly described with reference to FIGS. 5 to 8.

Figure 5:
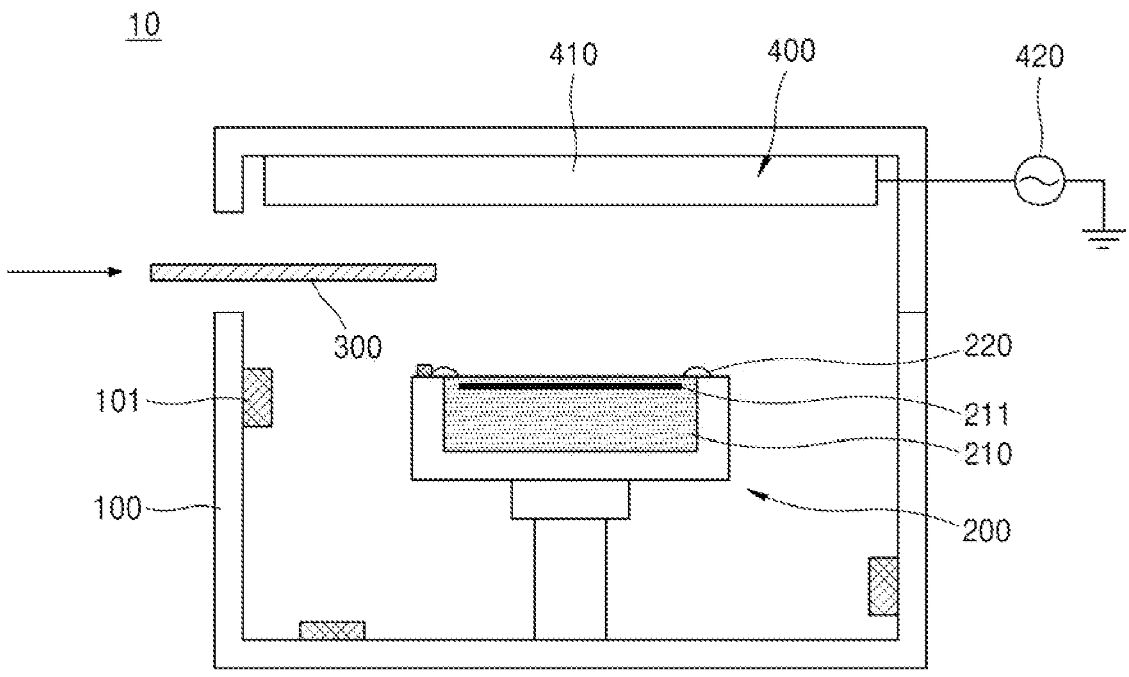
FIGS. 5 to 8 are cross-sectional views of stages in a method of cleaning a substrate processing apparatus, according to an embodiment.

FIG. 5 illustrates an operation of disposing the cover wafer 300 on the substrate support 200. The cover wafer 300 may be introduced to the inside of the chamber 100 through a gate at one side of the chamber 100. In an implementation, the cover wafer 300 may be introduced to the inside of the chamber 100 and disposed on the substrate support 200 using a load arm.

The cover wafer 300 may include SiC. In an implementation, the cover wafer 300 may not chemically react with a cleaning gas used during plasma cleaning. In an implementation, the cover wafer 300 may include CVD-SiC.

The average roughness of an upper surface of the cover wafer 300 may be less than the average roughness of an upper surface of a process wafer. In an implementation, the upper surface of the cover wafer 300 may be smoother than the upper surface of the process wafer. In an implementation, the average roughness of the upper surface of the cover wafer 300 may be about 0.05 μm to about 0.15 μm.

The average roughness of a lower surface of the cover wafer 300 may be less than the average roughness of the upper surface of the process wafer. In an implementation, the lower surface of the cover wafer 300 may be smoother than the upper surface of the process wafer. In an implementation, the average roughness of the lower surface of the cover wafer 300 may be about 0.05 μm to about 0.15 μm.

In an implementation, a polishing process may be performed on the upper surface and the lower surface of the cover wafer 300 (e.g., in preparation for its use) such that the average roughness of the upper surface of the cover wafer 300 and the average roughness of the lower surface of the cover wafer 300 are less than the average roughness of the upper surface of the process wafer. In an implementation, the polishing process may include a chemical mechanical polishing (CMP) process.

In an implementation, the Vickers hardness of the cover wafer 300 may be about 11 GPa to about 50 GPa. In an implementation, the Young's modulus of the cover wafer 300 may be about 350 GPa to about 600 GPa. In an implementation, the specific resistance of the cover wafer 300 may be about 0.01 ohm·cm to about 10,000 ohm·cm.

Figure 6:
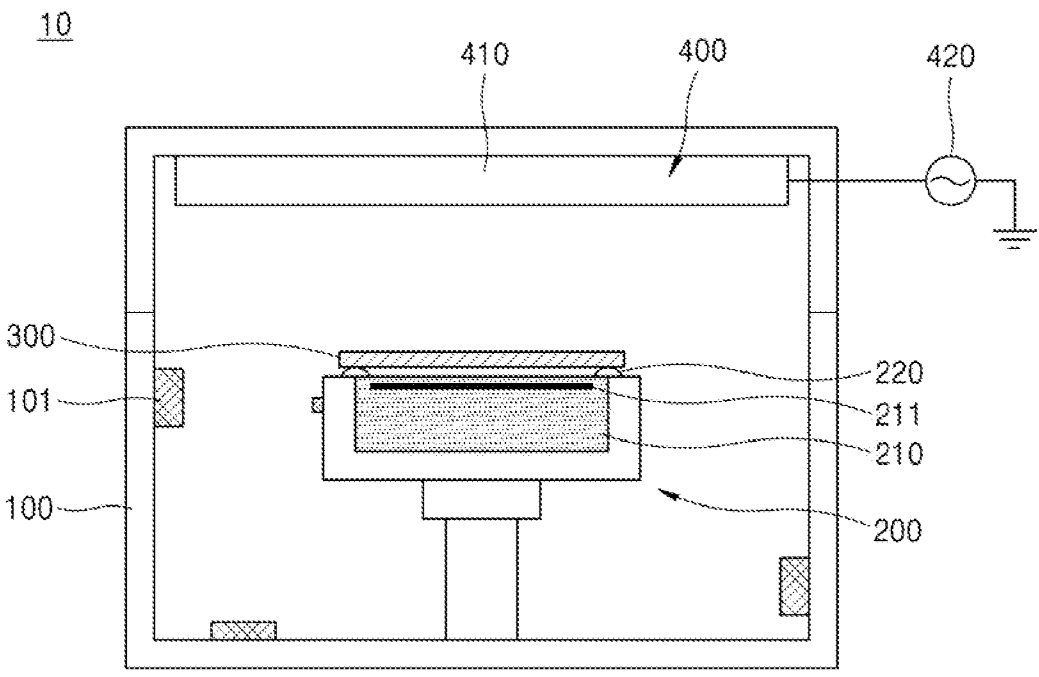

FIG. 6 illustrates an operation of applying power to the internal electrode 211 of the substrate support 200 to fix the cover wafer 300 to the substrate support 200. In an implementation, the substrate support 200 may generate an electrostatic force by applying power to the internal electrode 211 inside the dielectric plate 210. The cover wafer 300 may be fixed to the substrate support 200 by the electrostatic force.

Figure 7:
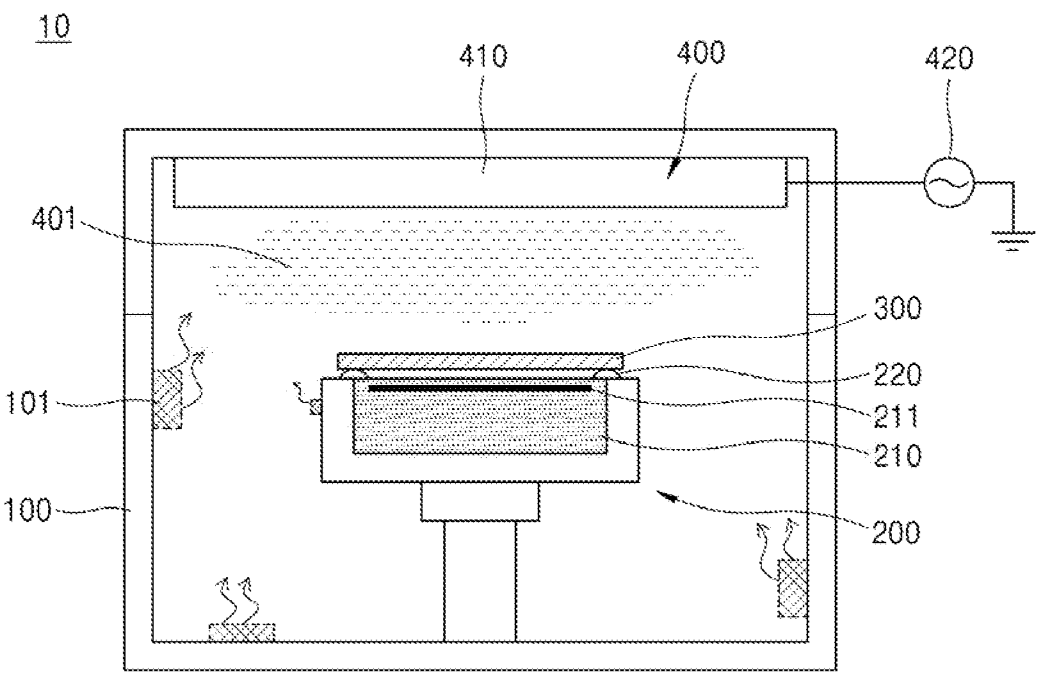

FIG. 7 illustrates an operation of performing plasma cleaning of a processing space. The plasma source 400 may excite the cleaning gas to form plasma 401. The plasma 401 may react with the residue 101 attached in the processing space to remove the residue 101.

In an implementation, the plasma 401 may be formed by a CCP scheme. In an implementation, the plasma source 400 may include the upper electrode 410 and the external power source 420, and the internal electrode 211 of the dielectric plate 210 may act as a lower electrode. In a plasma device of a CCP scheme, the internal electrode 211 may act as a lower electrode such that removed residue 101 is induced to the internal electrode 211. Vaporized residue 101 could flow toward the internal electrode 211, thereby resulting in a damage to the dielectric plate 210. Accordingly, when a plasma device of a CCP scheme is cleaned, the cover wafer 300 may cover the dielectric plate 210 to suppress damage to the dielectric plate 210.

In an implementation, the external power source 420 of the plasma source 400 may apply power of about 1,500 W to about 3,000 W to the upper electrode 410. A plasma cleaning process may be performed for about 30 seconds to about 60 seconds. Corrosion of the dielectric plate 210, which could otherwise occur during plasma cleaning, may be suppressed by the cover wafer 300, thereby increasing the power of the external power source 420. By increasing the power, the time taken for a process of cleaning the processing space may be reduced.

Figure 8:
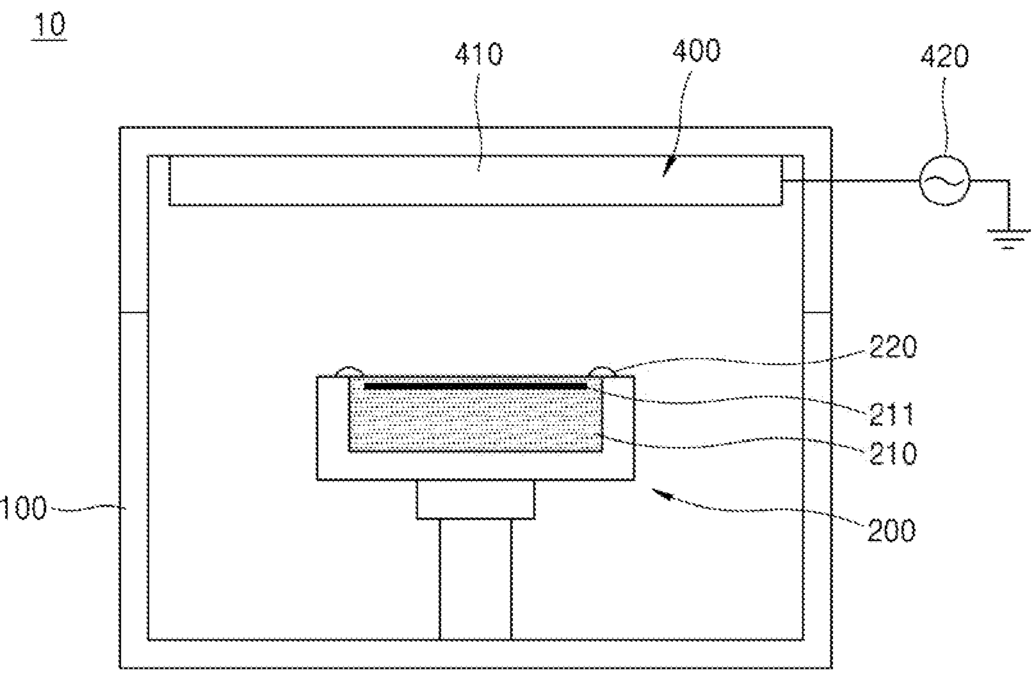

FIG. 8 illustrates an operation of removing the cover wafer 300. The power applied to the internal electrode 211 of the substrate support 200 may be blocked or cut off to remove the electrostatic force of the substrate support 200. When the electrostatic force is removed, the cover wafer 300 may be removed from the substrate support 200. Thereafter, the cover wafer 300 may be discharged or removed to the outside of the chamber 100 through or using the load arm.

A method of cleaning a substrate cleaning apparatus, according to an embodiment, may help suppress damage to the dielectric plate 210 by using the cover wafer 300 to cover the dielectric plate 210. A method of cleaning a substrate cleaning apparatus, according to an embodiment, may use the cover wafer 300 including SiC, which may not react with cleaning gas, thereby suppressing the generation of particles. A method of cleaning a substrate cleaning apparatus, according to an embodiment, may use the cover wafer 300 having an upper surface of which the average roughness is about 0.05 μm to about 0.15 μm, thereby suppressing a phenomenon that particles are generated by physical impacts.

Figure 9:
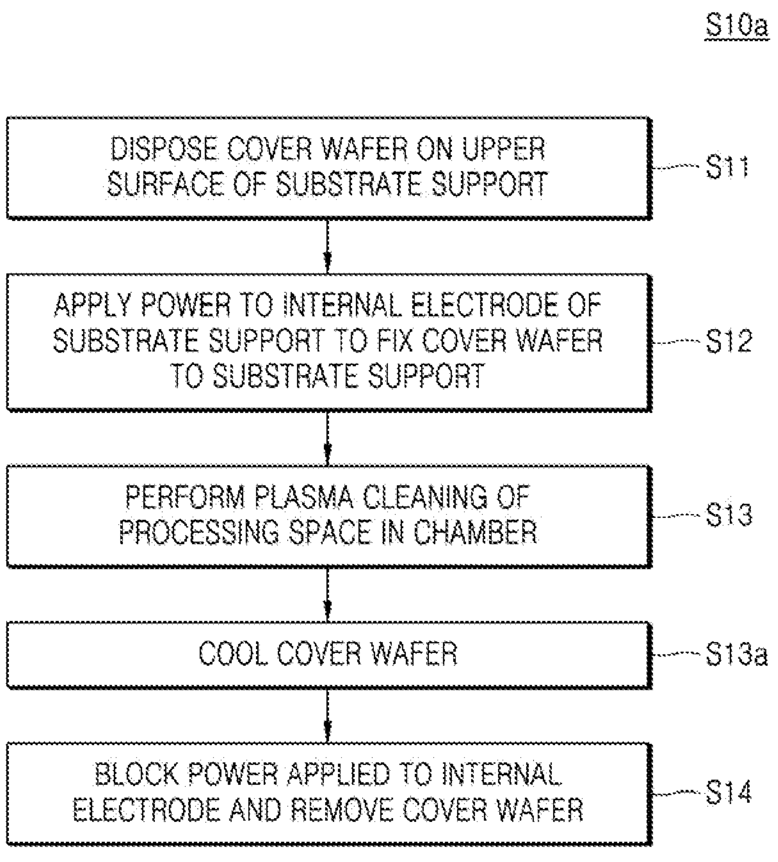
FIG. 9 is a flowchart illustrating a method of cleaning a substrate processing apparatus, according to an embodiment.

FIG. 9 is a flowchart illustrating a method S10*a* of cleaning a substrate processing apparatus, according to an embodiment.

Hereinafter, a description made in the method S10 of FIG. 4 may not be repeated in a description of the method S10*a* of FIG. 9, and differences therebetween are described.

Referring to FIG. 9, the method 10*a* may further include a cooling operation S13*a*. In an implementation, an operation of cooling a cover wafer while performing plasma cleaning of a processing space of a chamber may be performed.

A substrate support may include a hole through which a cooling fluid is discharged. The hole may be between a plurality of support portions. The substrate support may discharge the cooling fluid through the hole toward a lower surface of the cover wafer. In an implementation, the cooling fluid may be introduced to a separation space between an upper surface of the substrate support and the cover wafer by the plurality of support portions. In an implementation, the cooling fluid may include an inert gas.

In an implementation, the substrate support may include therein a pipe through which the cooling fluid flows. In an implementation, the cooling fluid may flow inside the substrate support to cool the cover wafer. In an implementation, the cooling fluid may not be in direct contact with the cover wafer to cool the cover wafer.

During a cleaning process, heat may be generated in the cover wafer by plasma such that a temperature of the cover wafer may increase. If the temperature of the cover wafer were to increase, a physical shape of the cover wafer could be deformed, or a physical property of the cover wafer could change. Accordingly, the lifespan of the cover wafer could be reduced. A method of cleaning a substrate processing apparatus, according to an embodiment, may adjust a temperature of a cover wafer through a cooling process. In an implementation, the temperature of the cover wafer may be decreased, thereby lengthening the lifespan of the cover wafer.

Figure 10:
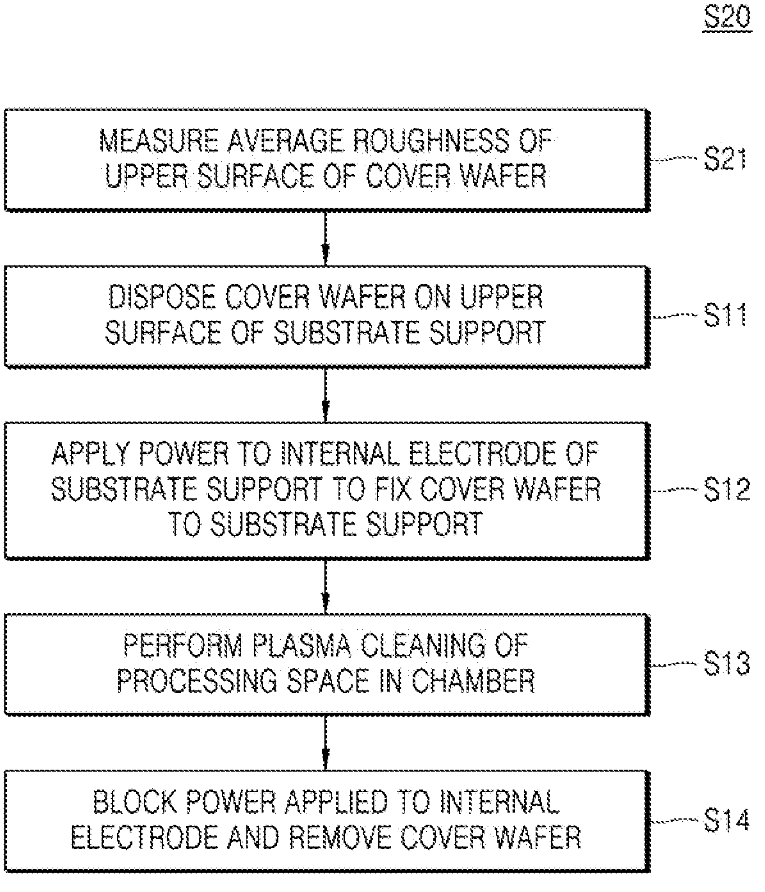
FIG. 10 is a flowchart illustrating a method of cleaning a substrate processing apparatus, according to an embodiment.

FIG. 10 is a flowchart illustrating a method S20 of cleaning a substrate processing apparatus, according to an embodiment.

Hereinafter, a description made in the method S10 of FIG. 4 may not be repeated in a description of the method S20 of FIG. 10, and differences therebetween are described.

Referring to FIG. 10, the method S20 may further include a checking operation S21. In an implementation, before disposing a cover wafer in a chamber, operation S21 of measuring the average roughness of an upper surface of the cover wafer may be performed.

In an implementation, a method of measuring the average roughness of the upper surface of the cover wafer may use optical measurement equipment. In an implementation, the average roughness of the upper surface of the cover wafer may be calculated or measured using optical equipment. In an implementation, heights and intervals of a plurality of concaves and convexes on the upper surface of the cover wafer may be measured using the optical equipment. Based on the measured values, a central line and an average line may be calculated to obtain the average roughness of the upper surface of the cover wafer.

In an implementation, the average roughness of a lower surface of the cover wafer may be measured in the same manner as the method of measuring the average roughness of the upper surface of the cover wafer.

In some methods of cleaning a substrate processing apparatus, the average roughness of the surface of a cover wafer to be used may not affect the lifespan of the cover wafer, and thus, a replacement time of a cover wafer may be determined based on the number of particles attached to the process wafer in a plasma process after a plasma cleaning process. A method of cleaning a substrate processing apparatus, according to an embodiment, may measure the average roughness of an upper surface of a cover wafer to determine a replacement time. Accordingly, the use of a cover wafer of which the lifespan has expired may be prevented.

Figure 11:
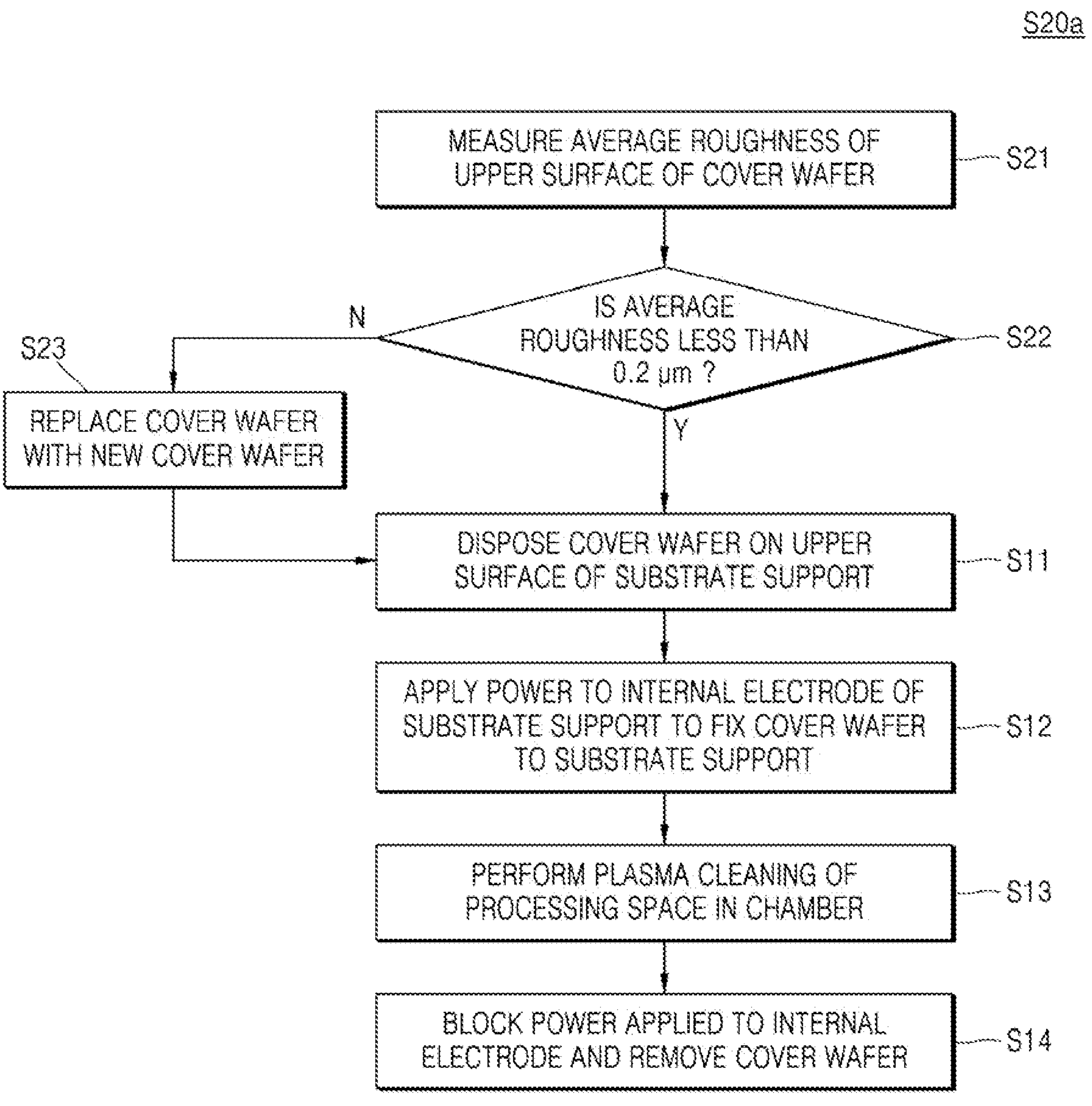
FIG. 11 is a flowchart illustrating a method of cleaning a substrate processing apparatus, according to an embodiment.

FIG. 11 is a flowchart illustrating a method S20*a* of cleaning a substrate processing apparatus, according to an embodiment.

Hereinafter, a description made in the method S20 of FIG. 10 may not be repeated in a description of the method S20*a* of FIG. 11, and differences therebetween are described.

Referring to FIG. 11, the method S20*a* may further include cover wafer lifespan determination operation S22 and replacement operation S23.

Particularly, after a process of examining a cover wafer, operation S22 of determining whether the average roughness of an upper surface of the cover wafer is less than 0.2 μm may be performed. If the average roughness of the upper surface of the examined cover wafer is less than 0.2 μm, it may be determined that the examined cover wafer is still usable. If the average roughness of the upper surface of the examined cover wafer is greater than or equal to 0.2 μm, it may be determined that the examined cover wafer is unusable.

If it is determined that the examined cover wafer is unusable, the examined cover wafer may be replaced with a new cover wafer, and the new cover wafer may be disposed on a substrate support. The average roughness of an upper surface of the new cover wafer may be about 0.05 μm to about 0.15 μm. In an implementation, a cover wafer may be examined before being disposed on the substrate support, and may be replaced with a new cover wafer.

A method of cleaning a substrate processing apparatus, according to an embodiment, may include replacing a cover wafer with a cover wafer based on the average roughness of an upper surface of the cover wafer. Accordingly, a cover wafer may be replaced before plasma cleaning, thereby increasing yield in a process.

By way of summation and review, in a plasma process, carbon residue or aluminum residue could be formed on a substrate support, inside a chamber, or the like. The residue could be attached to an active surface of a process wafer during a subsequent plasma process, thereby contaminating the process wafer. Eventually, the residue could result in a decrease in an effective semiconductor yield.

Therefore, to improve the yield of a process wafer, a plasma cleaning process may remove residue remaining inside a chamber used for a plasma process. However, during plasma cleaning, particles could be generated on a substrate support.

One or more embodiments may provide a cover wafer used in a plasma process chamber.

One or more embodiments may provide a cover wafer by which the generation of particles may be suppressed during plasma cleaning.

One or more embodiments may provide a cover wafer protecting an electrostatic chuck during plasma cleaning.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of cleaning a substrate processing apparatus that provides a processing space for accommodating a process wafer and includes a substrate support including an internal electrode, the method comprising:
- disposing a cover wafer on an upper surface of the substrate support;
- fixing the cover wafer to the substrate support using the internal electrode of the substrate support;
- plasma cleaning the processing space; and
- removing a current of the internal electrode and removing the cover wafer, wherein:
- the cover wafer includes silicon carbide (SiC),
- a lower surface of the cover wafer is in contact with the substrate support, and
- an average roughness of an upper surface of the cover wafer is less than an average roughness of an upper surface of the process wafer.

2. The method as claimed in claim 1, wherein the average roughness of the upper surface of the cover wafer is about 0.05 μm to about 0.15 μm.

3. The method as claimed in claim 1, wherein an average roughness of the lower surface of the cover wafer is less than the average roughness of the upper surface of the process wafer.

4. The method as claimed in claim 1, wherein an average roughness of the lower surface of the cover wafer is about 0.05 μm to about 0.15 μm.

5. The method as claimed in claim 1, wherein a specific resistance of the cover wafer is about 0.01 ohm·cm to about 10,000 ohm·cm.

6. The method as claimed in claim 1, wherein, in the plasma cleaning, a power of about 1,500 W to about 3,000 W is used.

7. The method as claimed in claim 6, wherein the plasma cleaning is performed for about 30 seconds to about 1,000 seconds.

8. The method as claimed in claim 1, wherein plasma cleaning the processing space includes plasma cleaning with a capacitively coupled plasma (CCP) process.

9. The method as claimed in claim 1, further comprising measuring the average roughness of the upper surface of the cover wafer.

10. The method as claimed in claim 9, wherein measuring the average roughness of the upper surface of the cover wafer is performed using optical measurement equipment.

11. The method as claimed in claim 9, further comprising replacing the cover wafer with a new cover wafer having an upper surface of which an average roughness is about 0.05 μm to about 0.15 μm if the average roughness of the upper surface of the cover wafer is measured to be greater than or equal to 0.2 μm.

12. The method as claimed in claim 1, wherein plasma cleaning the processing space further includes discharging a cooling fluid from the substrate support toward the lower surface of the cover wafer.

13. The method as claimed in claim 12, wherein the cooling fluid includes an inert gas.

14. A method of cleaning a substrate processing apparatus that provides a processing space for accommodating a process wafer and includes a substrate support including a dielectric plate, the method comprising:
- disposing a cover wafer on an upper surface of the substrate support;
- fixing the cover wafer to the substrate support using an internal electrode of the dielectric plate of the substrate support;
- plasma cleaning the processing space; and
- removing a current of the internal electrode and removing the cover wafer, wherein:
- the cover wafer includes silicon carbide (SiC),
- a width of an upper surface of the cover wafer is greater than a width of an upper surface of the dielectric plate,
- a lower surface of the cover wafer is in contact with the substrate support, and
- an average roughness of the upper surface of the cover wafer is less than an average roughness of an upper surface of the process wafer.

15. The method as claimed in claim 14, wherein the width of the upper surface of the cover wafer is less than a width of the substrate support.

16. The method as claimed in claim 14, wherein the average roughness of the upper surface of the cover wafer is a same as the average roughness of the lower surface of the cover wafer.

17. The method as claimed in claim 14, wherein:
- the average roughness of the upper surface of the cover wafer is about 0.05 μm to about 0.15 μm, and
- the average roughness of the lower surface of the cover wafer is about 0.05 μm to about 0.15 μm.

18. The method as claimed in claim 14, wherein the width of the upper surface of the cover wafer is less than a width of the upper surface of the process wafer.

19. A method of cleaning a substrate processing apparatus that provides a processing space for accommodating a process wafer and includes a substrate support including a dielectric plate, the method comprising:
- disposing a cover wafer on a plurality of support portions of the substrate support;
- fixing the cover wafer to the substrate support using an internal electrode of the dielectric plate of the substrate support;
- plasma cleaning the processing space; and
- removing a current of the internal electrode and removing the cover wafer, wherein:
- the cover wafer includes silicon carbide (SiC),
- a width of an upper surface of the cover wafer is greater than a width of an upper surface of the dielectric plate and less than a width of the substrate support,
- a lower surface of the cover wafer is in contact with the substrate support, and an average roughness of the upper surface of the cover wafer is less than an average roughness of an upper surface of the process wafer the average roughness of the upper surface of the cover wafer is about 0.05 μm to about 0.15 μm.

20. The method as claimed in claim 19, further comprising measuring the average roughness of the upper surface of the cover wafer, and replacing the cover wafer with a new cover wafer having an upper surface of which an average roughness is about 0.05 μm to about 0.15 μm if the average roughness of the upper surface of the cover wafer is measured to be greater than or equal to 0.2 μm.

* * * * *